(12) United States Patent
Rahman

(10) Patent No.: US 8,216,936 B1
(45) Date of Patent: Jul. 10, 2012

(54) LOW CAPACITANCE ELECTRICAL CONNECTION VIA

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 21 days.

(21) Appl. No.: 12/909,706

(22) Filed: Oct. 21, 2010

(51) Int. Cl.
*H01L 21/768* (2006.01)
*H01L 21/441* (2006.01)

(52) U.S. Cl. ......... 438/667; 257/E21.585; 257/E21.589; 257/E23.174

(58) Field of Classification Search ................. 438/667; 257/E21.589, E21.585, E23.174
See application file for complete search history.

(56) References Cited

U.S. PATENT DOCUMENTS

| | | | | |
|---|---|---|---|---|
| 6,908,856 | B2 * | 6/2005 | Beyne et al. | 438/667 |
| 7,521,360 | B2 * | 4/2009 | Halahan et al. | 438/678 |
| 2002/0084513 | A1 * | 7/2002 | Siniaguine | 257/621 |
| 2007/0184654 | A1 * | 8/2007 | Akram et al. | 438/675 |
| 2009/0032951 | A1 * | 2/2009 | Andry et al. | 257/751 |
| 2009/0039471 | A1 * | 2/2009 | Katagiri | 257/620 |
| 2009/0296310 | A1 * | 12/2009 | Chikara | 361/301.4 |
| 2010/0140751 | A1 * | 6/2010 | Tay et al. | 257/621 |
| 2010/0261318 | A1 * | 10/2010 | Feng et al. | 438/132 |
| 2011/0108948 | A1 * | 5/2011 | Kim et al. | 257/532 |

OTHER PUBLICATIONS

Gerke, David, *NASA 2009 Body of Knowledge (BoK): Through-Silicon Via Technology*, JPL Pub. 09-28, Nov. 2009, pp. 1-40, Jet Propulsion Laboratory, Pasadena, California, USA.

* cited by examiner

*Primary Examiner* — William D Coleman
*Assistant Examiner* — Christine Enad
(74) *Attorney, Agent, or Firm* — LeRoy D. Maunu

(57) ABSTRACT

In one embodiment, a method is presented for formation of a through-silicon via in a silicon substrate. A via is etched in the silicon substrate. A first layer of oxide film is deposited on side walls of the via and on a first surface of the silicon substrate. At least a portion of the first layer of oxide film formed on the first surface of the silicon substrate is etched, and a second layer of oxide film is deposited on side walls of the via and. A conductor is deposited in the via.

9 Claims, 6 Drawing Sheets

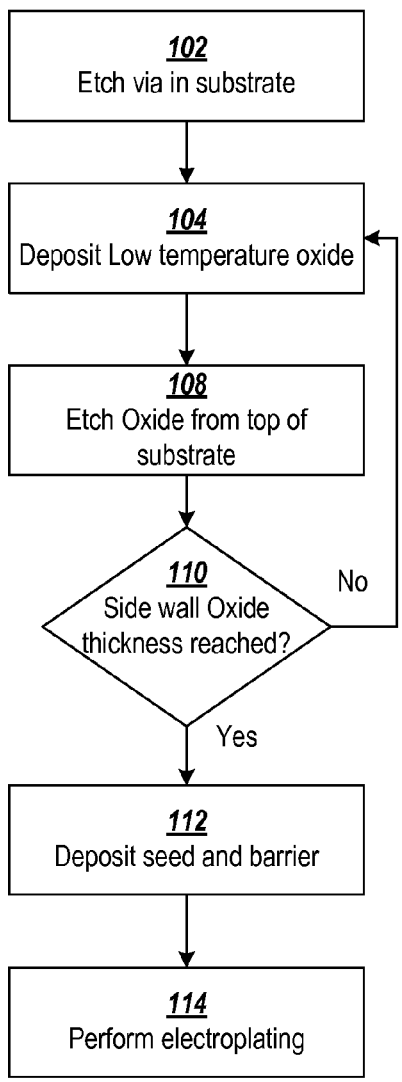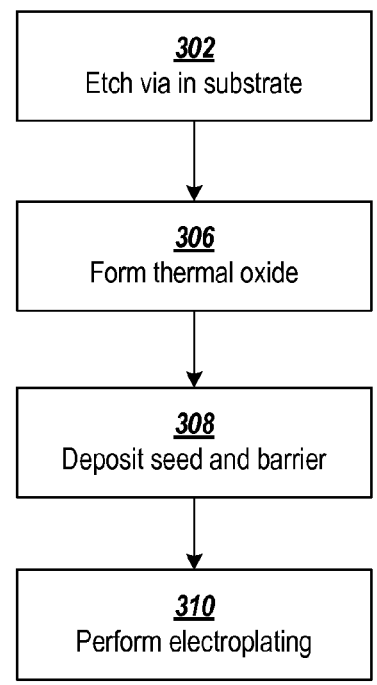
FIG. 1
FIG. 3

LOW CAPACITANCE ELECTRICAL CONNECTION VIA

FIELD OF THE INVENTION

One or more embodiments generally relate to vias for providing a signal path between conductors separated by a non-conductive layer, and in particular to a via resistant to parasitic capacitance.

BACKGROUND

In the development of integrated circuit (IC) technologies, there is continuous pressure to reduce size and power consumption of the IC, and at the same time increase performance. To achieve these goals, three dimensional integrated circuit architectures have been developed to facilitate miniaturization and shorten interconnection between different ICs. Three dimensional ICs include two or more ICs that are arranged in multiple layers that are interconnected vertically in order to occupy less space and reduce propagation delay between the two or more ICs. The multiple layers may be epitaxially grown, or fully processed ICs can be bonded together for vertical integration.

In many three-dimensional ICs, the IC layers are interconnected with wiring along their edges. However, as semiconductor technology has advanced, the amount and speed of logic available on an IC has increased more rapidly than the number and performance of input/output (I/O) connections. Additionally, because each interconnection must be routed to the edge, signal line lengths are increased, and the number of interconnections may be limited. An interposer layer is often included between each IC layer to perform interlayer routing. The interposer routing further increases interconnection wiring length.

A more recent trend is to replace edge wiring of each IC layer with vertical connections through the body of the stacked ICs. These vertical interconnections are referred to as through silicon vias (TSVs). To form a TSV, a hole is etched through the silicon body of the IC and filled with a conductive material such as copper. The conductive material is surrounded by a dielectric barrier. Through the use of TSVs, interconnects between the IC layers may be shortened, allowing reduced timing delays, faster clock speeds, and reduced power consumption.

Although TSVs allow signal line lengths to be reduced between layer interconnect points, transmission delays may result from parasitic capacitance and inductance exhibited by the TSV interconnections. As distances the multi-layered interconnection structure increase, parasitic capacitance and parasitic impedance induced by the TSV become more significant. At high clock speeds, performance is affected by parasitic resistance and capacitance introduced by TSVs. The effect of parasitic resistance on performance degradation is minimal. However, unless properly designed, the parasitic capacitance of a TSV can have significant impact on I/O performance.

The embodiments of present invention may address one or more of the above issues.

SUMMARY

In one embodiment, a method is provided for formation of a through-silicon via in a silicon substrate. A via is formed in a first surface of the silicon substrate. After forming the via, the silicon substrate is heated to form a layer of oxide film on side walls of the via. The via is then filled with a conductor.

In another embodiment, a method of forming a through-silicon via in a silicon substrate is presented. A via is etched in the silicon substrate. A first layer of oxide film is deposited on side walls of the via and on a first surface of the silicon substrate. At least a portion of the first layer of oxide film formed on the first surface of the silicon substrate is etched and a second layer of oxide film is deposited on side walls of the via. A conductor is then deposited in the via.

In yet another embodiment, a method for producing an interposer is provided. An interposer body, including a plurality of alternate planer conductive layers and planer dielectric layers formed on a substrate, is formed. The interposer body has a first surface and a second surface. A plurality of vias penetrating the interposer body is formed between the first surface and the second surface. Vias are formed in the first surface of the interposer body. Heat is applied to the silicon substrate after forming the vias to form a layer of oxide film on side walls of the via. The vias are filled with a metallic conductor.

It will be appreciated that various other embodiments are set forth in the Detailed Description and Claims, which follow.

BRIEF DESCRIPTION OF THE DRAWINGS

Various aspects and advantages will become apparent upon review of the following detailed description and upon reference to the drawings in which:

FIG. 1 shows a flowchart of an example process for formation of a through-silicon via with low temperature oxide;

FIGS. 2-1-2-7 illustrate the formation of a TSV with low temperature oxide;

FIG. 3 shows a flowchart of an example process for formation of a TSV with thermal oxide;

FIGS. 4-1-4-4 illustrate the formation of a TSV with thermal oxidation;

FIG. 5 shows a flowchart of an example process for formation of a TSV in a substrate with active integrated circuits;

FIGS. 6-1-6-5 illustrate the formation of a TSV in a substrate alongside active integrated circuit components where thermal oxide is used to temporarily fill the via during other processing of the substrate; and FIG. 7 illustrates the formation of a TSV in a substrate alongside active integrated circuit components where the via is temporarily filled with silicon during other processing of the substrate.

DETAILED DESCRIPTION

Figures 1, 2:
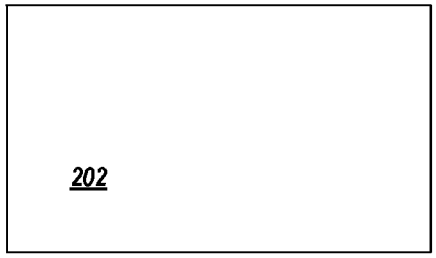
Figure 2:
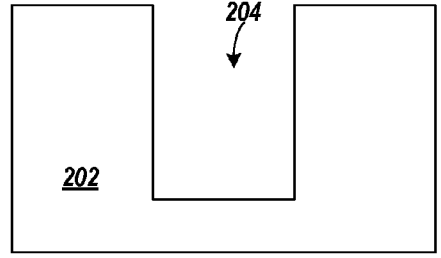

In high-speed integrated circuits (IC), parasitic capacitance induced by through silicon vias (TSVs) may have a significant impact on performance of the IC. TSVs provide a vertical conduit for electrical connections between stacked integrated circuits. The formation of a TSV entails deep-Si via etching, dielectric oxide layer formation along a high aspect ratio, and filling or plating of the via with a conductive material. Parasitic capacitance is primarily caused by an electric field formed across the oxide dielectric between the conductive material and the silicon body. The field strength, and therefore the parasitic capacitance, is primarily determined by the permeability and surface area of the oxide dielectric between the conductor and the silicon. Specifically, the capacitance of a TSV depends on the k-value of the silicon, the k-value of the insulating oxide dielectric, the oxide thickness, via diameter and length, and pitch between adjacent vias.

In TSV implementation, the k-values are generally fixed based on the selected materials, and the length, diameter, and pitch are generally limited by design rules. Capacitance of the via is inversely proportional to the thickness of the isolating oxide dielectric which may be controlled during TSV formation. However, in high aspect ratio applications such as TSVs, current methods for oxide formation may be unable to form oxide greater than 0.5 µm thick. To reduce via capacitance, methods are described for formation of a TSV with an oxide liner thicker than 1 µm.

The dielectric liner has the requirement to be conformal along each specific via, but must also provide a uniform amount of film formation across the chip irrespective of structure density (pitch) variations. As the dielectric liner provides electrical isolation and controls the capacitance of the individual TSV elements, any variation in dielectric thickness can lead to reliability issues and inconsistent signal delay through different TSVs.

Current methods for oxide formation on TSV via sidewalls utilize low temperature oxidation techniques. However, these low temperature oxidation methods do not result in a uniform formation of oxide in high aspect ratio applications due, in part, to the difference in effective circulation between the top and bottom of the via. With current methods, oxide formed on the top surface of the substrate may be three to five times the thickness of the oxide formed on the sidewalls of the via. This thick layer of oxide formed on the top surface creates wafer level stress, which complicates further processing. Additionally, the rate of oxide growth will generally be greater at the top in comparison to the bottom of the via. As oxidation continues, eventually the oxide will close off the top of the via creating a void in the via. For these reasons, the low temperature oxidation processes are generally understood to be limited to the formation of oxide less than 0.5 µm thick.

One or more embodiments provide a method to form a TSV with low parasitic capacitance. In these embodiments, oxidation is performed over several iterations of oxide deposition and etching. Oxide formation is followed by a blanket etch to remove oxide from the wafer surface. This process is repeated until the desired thickness of TSV sidewall oxide is deposited without growing a thick oxide on the top surface. Using this process, oxide thickness on both TSV sidewall and wafer surface can be controlled independently. As a result, a thicker oxide (>1 µm) may be formed on the TSV sidewall.

FIG. 1 shows a flowchart of an example process for formation of a through-silicon via (TSV). For ease of explanation, FIG. 1 is described in conjunction with FIGS. 2-1-2-7, which illustrate the formation of an example TSV in accordance with one implementation of the method shown in FIG. 1. A via 204 is etched in a silicon substrate 202 as shown in FIGS. 2-1 and 2-2 at process block 102. One skilled in the art will recognize that the etching may be performed using a number of methods including: chemical etch, mechanical etch, and laser etch, for example. A layer of oxide 206 is formed on the top surface of the substrate and on the sidewalls of the via 204 using a low temperature oxidation method at process block 104. Low temperature oxidation refers to a classification of several oxidation methods including high aspect ratio process (HARP), enhanced HARP (eHARP), chemical vapor deposition (CVD), sub-atmospheric CVD (SACVD), plasma enhanced CVD (PECVD), and other recognized by those skilled in the art.

Figures 2, 3:
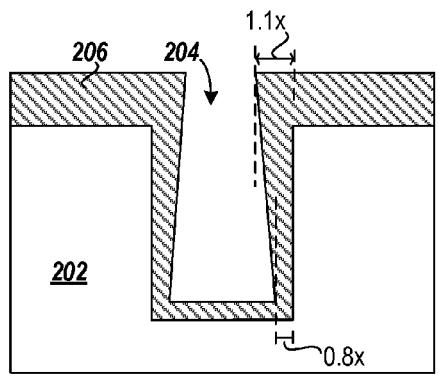
Figures 2, 3, 4:
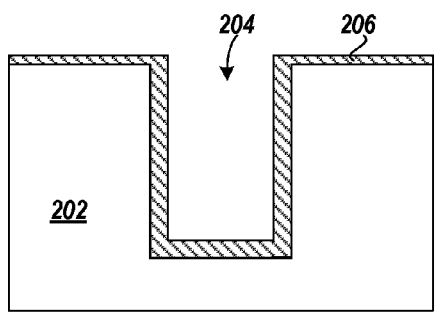

As illustrated in FIGS. 2-3, the thickness of the oxide layer is significantly thicker on the top surface than at the bottom of the via. As shown in FIGS. 2-4, an etching process is employed at process block 108 to reduce the oxide thickness on the top surface of the substrate and increase uniformity of the thickness of the oxide layer on the via sidewalls. If a desired sidewall oxide thickness has not been formed, decision block 110 directs the process to repeat low temperature oxidation at process block 104, which is also shown in FIG. 2-5.

When the desired thickness of the oxide layer has been formed, decision block 110, directs the process to block 112 for formation of a conductor in the via. Those skilled in the art will recognize that the conductor may be a metallic conductor such as copper or tungsten, or may be a conductive silicon compound. The metallic conductors may be formed using a number of methods recognized by those skilled in the art. For ease of explanation and illustration, the conductor is formed using electroplating. Seed and barrier layers 208, which are shown in FIGS. 2-6, are deposited at process block 112. Electroplating with the conductive material 210, which is shown in FIGS. 2-7, is performed at process block 114.

In one or more embodiments, the oxide dielectric layer is instead formed using thermal oxidation. In thermal oxidation, silicon is heated to a high temperature (usually between 700-1300° C.) in an oxidizing environment (e.g., rich in $O_2$ or $H_2O$) to promote the growth rate of oxide. Thermal oxidation produces an oxide that is more resistant to stresses caused by thermal expansion of the conductor material than oxide formed from low-temperature oxidation. Thermal oxidation can provide a more uniform oxidation rate, and thus need not be performed in iterative cycles to achieve thick sidewall oxidation as do embodiments that utilize low temperature oxidation.

FIG. 3 shows a flowchart of an example process for formation of a through-silicon via (TSV) using thermal oxidation. For ease of explanation, FIG. 3 is described in conjunction with FIGS. 4-1-4-4, which illustrate the formation of an example TSV in accordance with one implementation of the method shown in FIG. 3. A via 404 is etched in a substrate 402, which is shown in FIGS. 4-2, at process block 302. Thermal oxidation is performed at process block 306 to form thermal oxide 406 on via sidewalls as shown in FIGS. 4-3. As shown, the oxidation process results in oxide formation into and out from the substrate sidewall, with the original sidewall being located somewhere in the middle of the resulting oxide layer 406. Seed layer and barrier 408 are formed on the thermal oxide 406 at process block 308. Electroplating is performed at process block 310 to form a via conductor 410 as shown in FIG. 4-4.

Although this method has shown to produce high quality oxidation on the via sidewall, thermal oxidation may not be performed if active circuitry is also formed in the substrate. Heating of the substrate performed during thermal oxidation may cause dopants in different silicon regions to diffuse. However, in some situations forming TSVs before active circuitry is formed may not be feasible. If the conductor of the TSV is a material with a low melting point, such as copper, the thermal process used in forming active circuitry may cause the conductors to deform or melt.

Figures 2, 3, 4, 5:
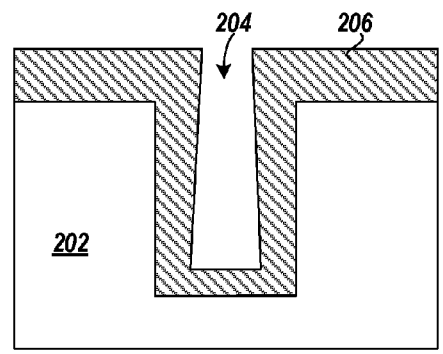
Figures 2, 3, 4, 5, 6:
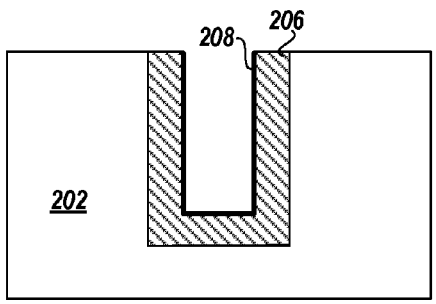

In one or more embodiments, TSVs are partially formed prior to formation of active components, and the formation of the TSVs is completed after formation of the active components. FIG. 5 shows a flowchart of an example process for formation of a TSV alongside active integrated circuits in a substrate using thermal oxidation. For ease of explanation, FIG. 5 is described in conjunction with FIGS. 6-1-6-5, which illustrate the formation of an example TSV in accordance with one implementation of the method shown in FIG. 5. At process block 502, a via 604 is etched in a substrate 602 as shown in FIGS. 6-2. The via 604 is filled with thermal oxide 608, which is shown in FIGS. 6-3, at process block 504. The filling of the via protects the via structure during other processing of the substrate, such as formation of active circuitry. After the via 604 is filled with oxide, active circuitry (not shown in FIGS. 6-1-6-5) may be formed in the substrate at process block 506. As shown in FIGS. 6-4, a second via 610 is formed in the thermal oxide 608 at process block 508. The diameter of the second via 610 may be selected such that the remaining thermal oxide 608 is the desired thickness. Seed and barrier layers, which are shown together as 612, are formed at process block 512. Electroplating is performed at block 514 to form the via conductor 614, which is shown in FIG. 6-5.

In the above example, the via is completely filled with oxide to protect the via structure during substrate processing. For very large vias, a longer time may be needed for the process to completely fill the via with oxide. To reduce processing time, in one or more embodiments, the via may be filled with an alternative material, such as silicon, to protect the via structure.

Figures 2, 3, 4, 5, 6, 7:
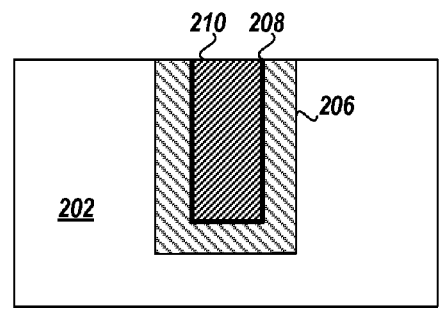
Figures 1, 4:
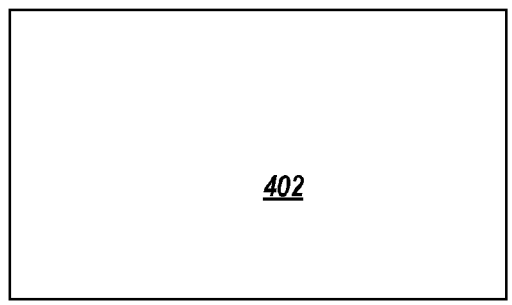
Figures 2, 4:
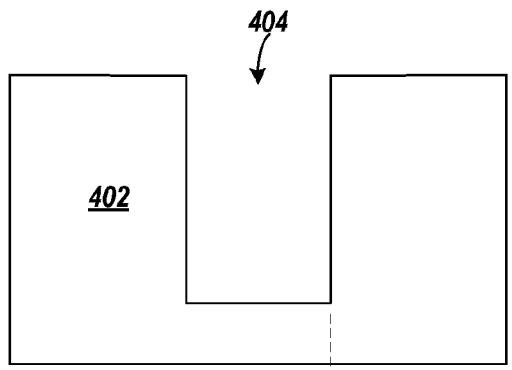
Figures 3, 4:
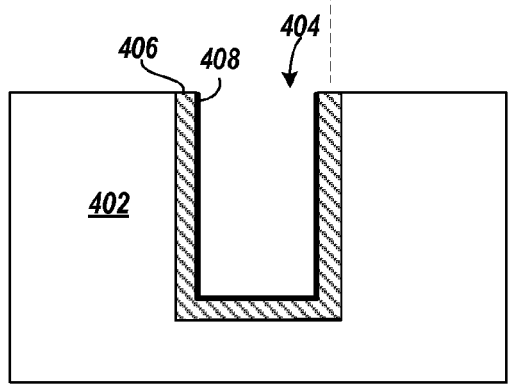
Figure 4:
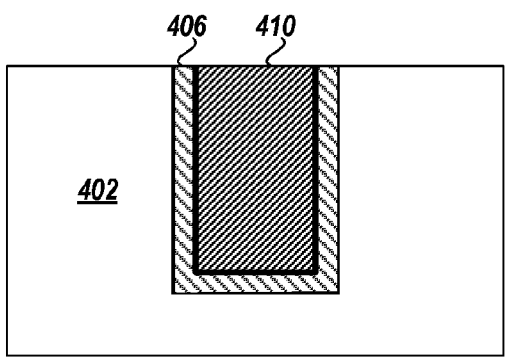
Figure 5:
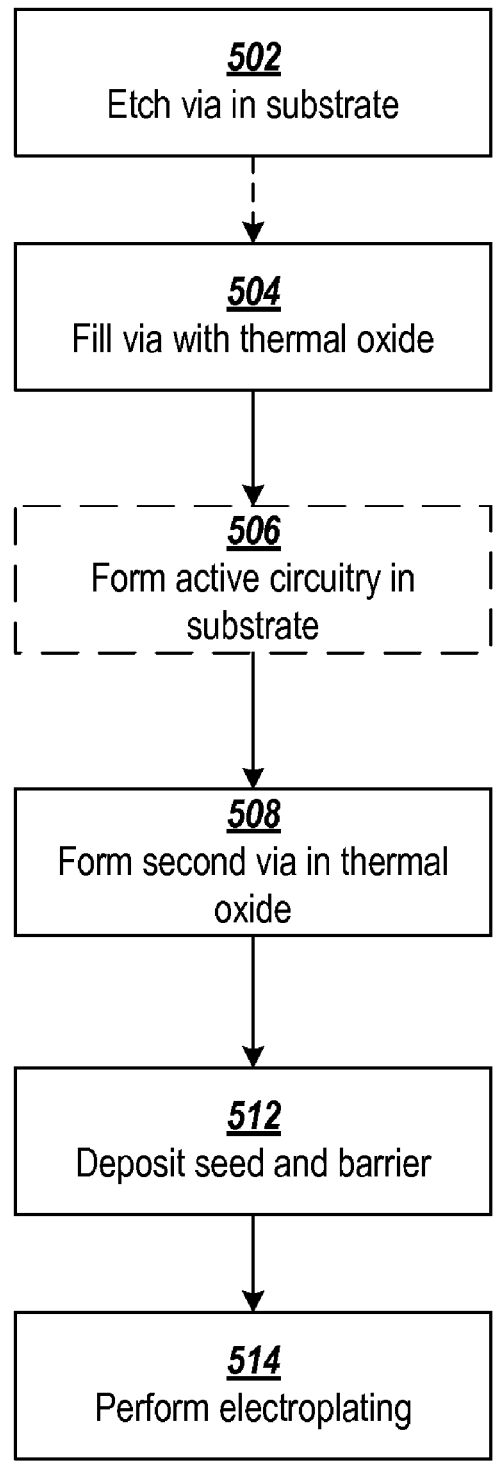
Figures 1, 6:
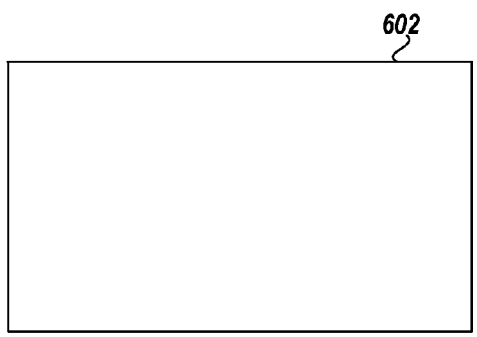
Figures 2, 6:
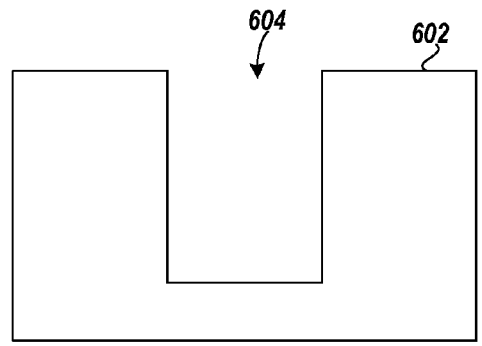
Figures 3, 6:
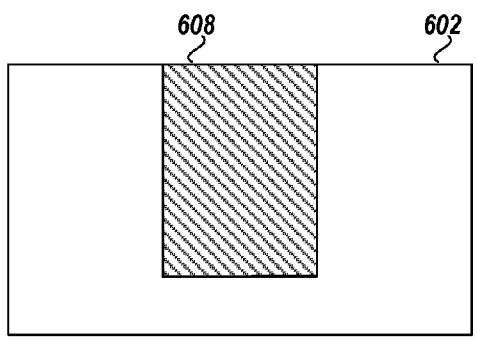
Figures 4, 6:
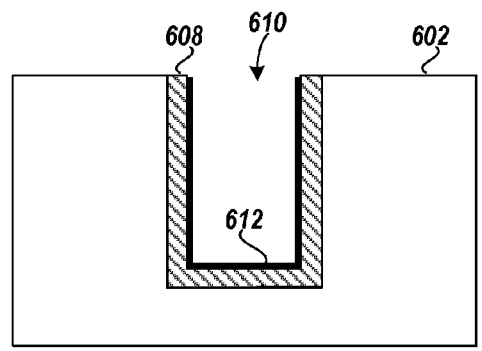
Figures 5, 6:
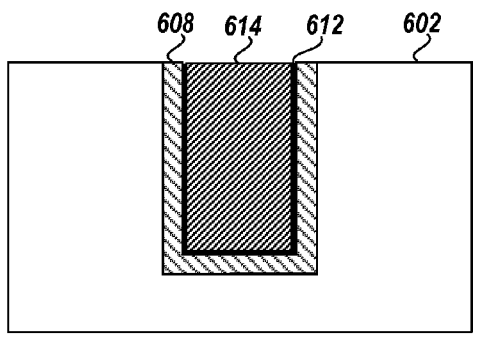
Figures 1, 7:
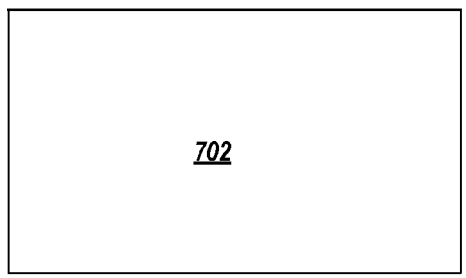
Figures 2, 7:
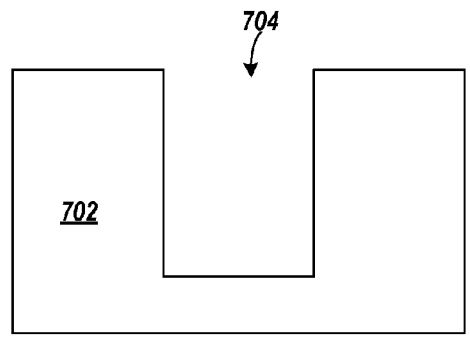
Figures 3, 7:
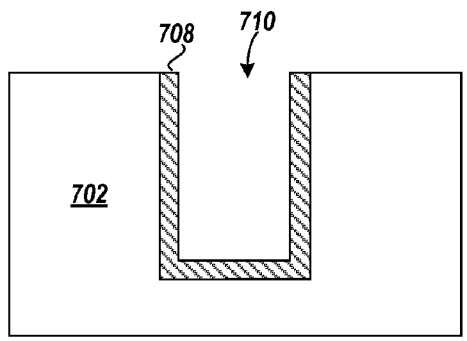
Figures 4, 7:
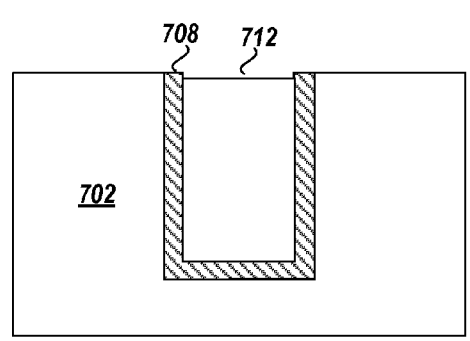
Figures 5, 7:
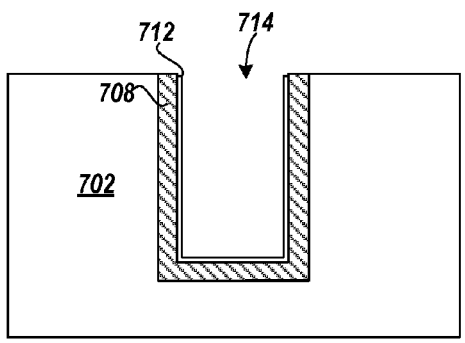
Figures 6, 7:
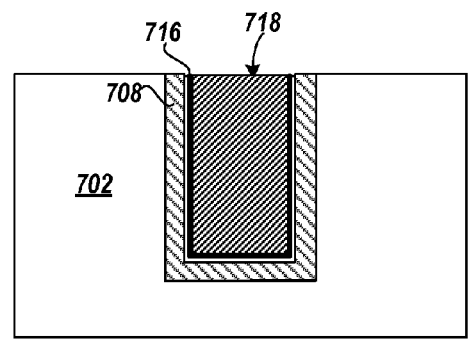

FIG. 7 illustrates the formation of an example TSV in accordance with one implementation of the method shown in FIG. 5, in which the via is filled with silicon to preserve the structure of the via. As shown in FIGS. 7-2, a via 704 is etched in a substrate 702. An oxide layer 708 is formed in the via 704 in FIGS. 7-3. The via 704 is filled with silicon 712 in FIGS. 7-4. After filling the via 704 with silicon, active circuitry (not shown) may be formed in the substrate. As shown in FIGS. 7-5, a second via 714 is formed in the silicon 712. Depending on the diameter of the second via 714, a portion or all of the silicon 712 may be removed. Seed and barrier layers, which are shown together as 716, are formed in the second via 714 in FIGS. 7-6. A via conductor 718 is formed in the via 714 to complete formation of the TSV.

The disclosed embodiments are thought to be applicable to a variety of via configurations and uses. For example, in one or more embodiments, a method is provided for the manufacture of interposers according to one or more of the above methods. An interposer is an electrical interface used to route signals from one socket to another. Interposers may be particularly useful to route signals between layers of stacked ICs, which do not have a common routing. Signals are rerouted from connections on a top surface to connections on a bottom surface. Depending on the implementation, interposers may include active or passive circuitry.

Other aspects and embodiments will be apparent to those skilled in the art from consideration of the specification and practice of the embodiments of the invention disclosed herein. It is intended that the specification and illustrated embodiments be considered as examples only, with a true scope and spirit of the invention being indicated by the following claims.

What is claimed is:

1. A method of forming a through-silicon via in a silicon substrate, comprising:
    prior to forming any active integrated circuit components in the substrate:
        forming a via in a first surface of the silicon substrate; and
        heating the silicon substrate after forming the via to form a layer of oxide film on side walls of the via, wherein the heating of the silicon substrate fills the via with the layer of oxide film;
    following formation of the layer of oxide film that fills the via, forming one or more active integrated circuit components in the substrate; and
    after the forming of the one or more active integrated circuit components,
        forming an additional via in the oxide film that fills the via; and
        filling the additional via with a conductor.

2. A method of producing an interposer, comprising:
    forming an interposer body including a plurality of alternate planer conductive layers and planer dielectric layers formed on a substrate, the interposer body having a first surface and a second surface; and
    forming a plurality of vias, each via extending from the first surface toward the second surface, wherein the forming of each via of the plurality of vias includes:
        prior to forming any active circuit components in the substrate:
            forming a via in the first surface of the interposer body;
            applying heat to the silicon substrate after forming the via to form a layer of oxide film on side walls of the via, wherein the applying of heat to the silicon substrate fills the via with the layer of oxide film;
        following formation of the layer of oxide film, forming one or more active integrated circuit components in the substrate; and
        following formation of the one or more active integrated circuit components:
            forming an additional via in the oxide film that fills the via; and
            filling the additional via with a metallic conductor.

3. The method of claim 1, wherein the filling of the via with a conductor includes:
    depositing a seed layer on side walls of the additional via; and
    electroplating the seed layer with the conductor.

4. The method of claim 1, wherein the oxide film remaining after forming the additional via is more than 1 μm (micron) thick.

5. The method of claim 1, wherein the one active integrated circuit component is a transistor.

6. The method of claim 1, further comprising removing a portion of a second surface of the silicon substrate to expose the conductor at the second surface.

7. The method of claim 1, further comprising performing chemical mechanical planarization (CMP) on the first surface of the substrate.

8. The method of claim 1, wherein, forming the additional via in the oxide film that fills the via is performed only after forming all active integrated circuit components in the substrate.

9. The method of claim 8, wherein all oxide formed by heating the substrate is formed prior to the forming of the one or more active integrated circuit components.

* * * * *